US012776682B1

(12) United States Patent
Jung et al.

(10) Patent No.: US 12,776,682 B1
(45) Date of Patent: Oct. 27, 2026

(54) HIGH EFFICIENCY ELECTRICAL MOTOR

(71) Applicant: Amazon Technologies, Inc., Seattle, WA (US)

(72) Inventors: Jakob Jung, Dresden (DE); Brett Ian Lyons, Burien, WA (US); Anay Arun, Kennewick, WA (US); Benjamin Woodward, Richland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 210 days.

(21) Appl. No.: 18/737,214

(22) Filed: Jun. 7, 2024

Related U.S. Application Data

(60) Provisional application No. 63/471,871, filed on Jun. 8, 2023.

(51) Int. Cl.

| | |
|---|---|
| ***H02K 7/14*** | (2006.01) |
| ***H02K 1/16*** | (2006.01) |
| ***H02K 1/26*** | (2006.01) |
| ***H02K 5/18*** | (2006.01) |
| ***H05K 7/20*** | (2006.01) |

(52) U.S. Cl.
CPC ............... *H02K 7/14* (2013.01); *H02K 1/165* (2013.01); *H02K 1/265* (2013.01); *H02K 5/18* (2013.01); *H05K 7/20718* (2013.01); *H02K 2201/03* (2013.01); *H02K 2213/03* (2013.01)

(58) Field of Classification Search
CPC .................................. H02K 7/14; H02K 9/06
See application file for complete search history.

(56) References Cited

U.S. PATENT DOCUMENTS 10,180,261 B1 * 1/2019 Ross ........................ F24F 11/30
10,203,689 B1 * 2/2019 Ortega Gutierrez .......................... G05B 23/0275
2022/0097816 A1 * 3/2022 Nakev ...................... H02K 7/14

* cited by examiner

*Primary Examiner* — Christopher M Koehler
*Assistant Examiner* — Ahmed F Seck
(74) *Attorney, Agent, or Firm* — Kilpatrick Townsend & Stockton LLP

(57) ABSTRACT

Techniques for a high efficiency electrical motor are described herein. The electrical motor includes a stator disposed in a housing and having a length that is at least forty percent of a length of the housing. The stator includes a first number of slots. A slot of the stator includes first windings. The electrical motor includes a first set of winding pins attached to a first side of the stator. The first set includes a first winding pin electrically coupled with a first winding of the first windings. The electrical motor includes a second set of winding pins that are attached to a second side of the stator. The second set includes a second winding pin electrically coupled with the first winding. The electrical motor includes a rotor that includes a second number of slots that is smaller than the first number. A slot of the rotor includes second windings.

20 Claims, 17 Drawing Sheets

ADD Motor Design v1.0

Comparison of simulation results @ main operation points

| | **Cold weather** 0.94kw/17% of nominal load | | **Mid-range** 1.85 kw/34% of nominal load | | **Warm weather** 2.57 kw/47% of nominal load | |
|---|---|---|---|---|---|---|
| | Motor 1 | Motor 2 | Motor 1 | Motor 2 | Motor 1 | Motor 2 |
| Stator winding | 38.5 W<br>$I_L$=3.85 $A_{RMS}$<br>$R_{phase}$=2.60Ω(Delta) | 14.5 W<br>$I$=3.81 $A_{RMS}$<br>$R_{phase}$=0.334Ω(Star)40°C | 76.2 W<br>$I_L$=5.23 $A_{RMS}$<br>$R_{phase}$=2.79Ω(Delta) | 26.8 W<br>$I$=4.99 $A_{RMS}$<br>$R_{phase}$=0.358Ω(Star)60°C | 114.3 W<br>$I_L$=6.20 $A_{RMS}$<br>$R_{phase}$=2.97Ω(Delta) | |
| Iron core | 22.9 W<br>Measured & scaled 59.7W | 13.3 w | 39.9 W<br>Measured & scaled 75.3W | 22.1 w | 53.4 W<br>Measured & scaled 84.1W | 28.6 w |
| Friction & windage (bearing fan) | 14.8 W<br>=Measured & scaled | 10 W<br>Assumption | 18.7 W<br>=Measured & scaled | 12 W<br>Assumption | 20.8 W<br>=Measured & scaled | |
| Rotor bar | 22.3 W | 6.5 w | 46.1 W | 12.2 w | 66.3 W | 17.1 w |
| Additional losses (eccentricty etc.) | 16.8 W<br>=Measured & scaled | 8 W<br>Assumption | 32.5 W<br>=Measured & scaled | 15 W<br>Assumption | 44.9 W<br>=Measured & scaled | |
| **Total losses** | **115.3W**<br>**Measured 131.1w** | **52.3 w** | **213.4 W**<br>**Measured 216.5 w** | **88.1 w** | **299.7 W**<br>**Measured 286.5 w** | **127.8 w** |
| **Efficiency** @shaftpower | 88.7%<br>Measured 88.1% | **94.7%** | 89.8%<br>Measured 89.7% | **95.4%** | 90.0%<br>Measured 90.0% | **95.5%** |
| | +6.0% Efficiency<br>-63 W losses | | +5.6% Efficiency<br>-125 W losses | | +5.5% Efficiency<br>-172 W losses | |

FIG. 3

Active Geometry – Main Dimensions

| Outer dimension of stator & rotor core | |
|---|---|
| Stack length = active length | 170.0 mm |
| Stator outer diameter | 219.0 mm |
| Stator inner diameter | 134.9 mm |
| No. of stator slots | 72 |
| | |
| Air gap between stator & rotor | 0.30 mm |
| | |
| Rotor outer diameter | 134.3 mm |
| Rotor inner diameter | 42.0 mm |
| No. of rotor slots | 64 |

- For the stator core, two different core materials are suitable
- Therefore, two different e-motors are built up
  - Motor_01: Core Material "Voestalpine Isocav 270-50A
  - Motor_02: Core Material "Voestalpine Isovac NO30-15HP"

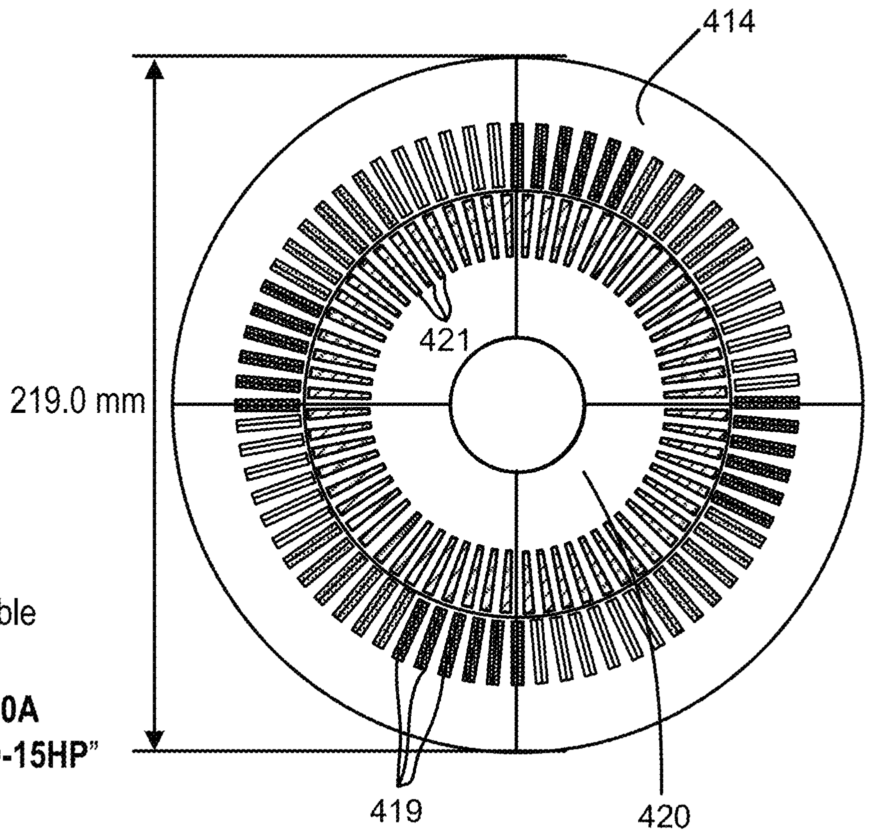

FIG. 4

Active Geometry – Stator

| Stator core | |
|---|---|
| Yoke height | 21.00 mm |
| Slot height (to air gap) | 21.05 mm |
| Slot width | 3.20 mm |
| Slot opening width | 1.10 mm |
| Tooth tip height | 0.80 mm |
| | |
| Fillet radii inner of the slot | 0.25 mm |
| Fillet radii tooth tip | 0.10 mm |
| | |
| Useable slot height (without tooth tips) | 20.25 mm |
| Useable slot area | 64.7463 $mm^2$ |

| Copper & insulation dimensions | |
|---|---|
| Slot liner width | 0.13 mm |
| Primary insulation thickness | 80 µm (2x PI-wrapped) |
| No. of conductors per slot | 10 |
| Copper height per conductor | 1.75 mm |
| Copper width per conductor | 2.65 mm |
| Copper radius | 0.30 mm |
| Copper area per conductor | 4.5602 $mm^2$ |
| Copper area per slot | 45.6024 $mm^2$ |
| Copper area per stator | 3283.4 $mm^2$ |
| Copper fill factor reg. usable slot area | 70.4% |

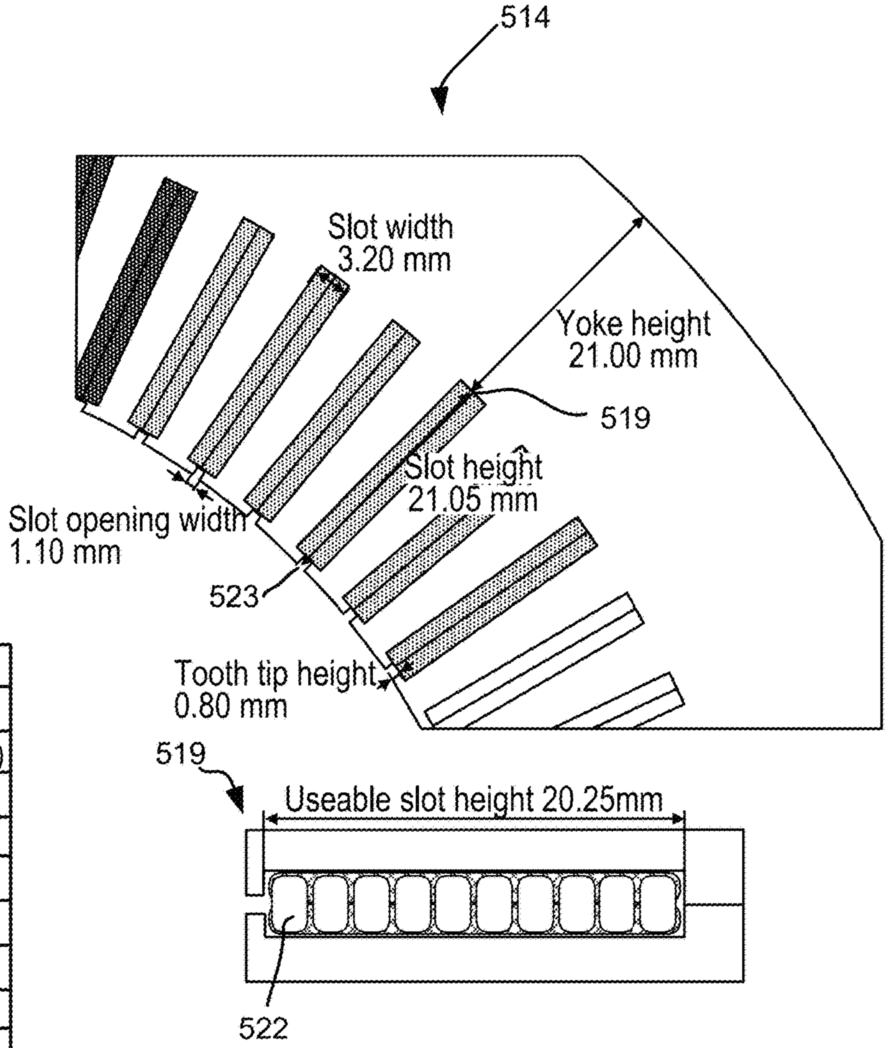

FIG. 5

Active Geometry – Rotor

| | |
|---|---|
| **Rotor core** | |
| Rotor tooth width | 3.20 mm |
| Rotor copper bar height | 20.00 mm |
| Bridge width (bar to air gap) | 0.60 mm |
| Fillet @ outer rotor bar | 0.80 mm |
| Fillet @ inner rotor bar | 0.50 mm |
| | |
| Rotor bar skewing | None |
| | |
| Copper area per bar | 46.61 mm$^2$ |
| Copper area per rotor | 2983.0 mm$^2$ |

Boundary Conditions of Electrical Motor

- Electrical motor must be plug&play solution replacement of conventional motor
  - Height of shaft center axis must be the same
  - Positions and size of bore holes for connection must be the same
- The internal fan for cooling is omitted

Winding Configuration

| Winding parameters | |
|---|---|
| Winding type | Hairpin, one layer |
| No. of pole pairs $p$ | 2 |
| No. of phases $m$ | 3 |
| No. of slots per pole and phase $p$ | 6 |
| No. of slots $N_{Sl}$ | 72 |
| No. of conductors per slot | 10 |
| No. of parallel paths per phase $a$ | 1 |
| Parallel strands per turn | 1 |
| No. of turns per coil $N_{Sp}$ | 10 |
| Connection type | Star |
| No. of turns in series per phase $N_{Ph}$ | 120 |
| Winding pitch | 18 slots |
| Short pitching | None |

Calculation of no. slots:

$N_{S1}=2 \cdot m \cdot p \cdot q \longrightarrow N_{S1}=2 \cdot 3 \cdot 2 \cdot 6=72$ Calculation of no. of turns in series per phase:

$N_{Ph}=\frac{N_N}{m} \cdot \frac{N_{Layers}}{2} \cdot \frac{1}{a} \cdot N_{Sp} \longrightarrow N_{Ph}=\frac{72}{3} \cdot \frac{1}{2} \cdot \frac{1}{1} \cdot 10=12 \cdot 10=\mathbf{120}$

| Phase resistance calculation | |
|---|---|
| Copper area per conductor | 4.5602 mm$^2$ |
| Electric resistance per meter wire @20°C | 3.7808 mΩ/m |
| Turn length=2 (actuve length+end turn)<br>Active length=170mm; end turn length=172 mm | 684 mm |
| Length per phase | 82.08 m |
| Phase-star point resistance, calculated @20°C | 310.3 mΩ |
| Phase-phase resistance, calculated @20°C | 620.6 mΩ |

Single layer winding / Einschichtwicklung (Hairpin):

N_cond=no. of conductors per slot, N_turns=no. of turns in series, N_slot=no. of slots

| $a$ | $q$ | $p$ | **N_Cond** | N_Turns | **N_Slots** | |
|---|---|---|---|---|---|---|
| 1 | 2 | 2 | 30 | 120 | 24 | |
| 1 | 3 | 2 | 20 | 120 | 36 | |
| 1 | 4 | 2 | 15 | 120 | 48 | |
| 1 | 5 | 2 | 12 | 120 | 60 | |
| **1** | **6** | **2** | **10** | **120** | **72** | **ADD_01** |

FIG. 14

Winding Configuration

| Winding parameters | |
|---|---|
| Widing type | Hairpin, one layer |
| No. of pole pairs *P* | 2 |
| No. of phases *m* | 3 |
| No. of slots per pole p and phase q | 6 |
| → No. of slots $N_{S1}$ | 72 |
| No. of conductors per slot | 10 |
| No. of parallel paths per phase *a* | 1 |
| parallel strands per turn | 1 |
| → No. of turns per coil $N_{Sp}$ | 10 |
| Connection type | star |
| → No. of turns in series per phase $N_{Ph}$ | 120 |
| Winding pitch | 180 slo s |
| → Short pitching | None |

Calculation of no. slots:

$N_{S1}=2 \cdot m \cdot p \cdot q \longrightarrow N_{S1}=2 \cdot 3 \cdot 2 \cdot 6=72$ Calculation of no. of turns in series per phase:

$N_{Ph}=\frac{N_N}{m} \cdot \frac{N_{Layers}}{2} \cdot \frac{1}{a} \cdot N_{Sp} \longrightarrow N_{Ph}=\frac{72}{3} \cdot \frac{1}{2} \cdot \frac{1}{1} \cdot 10=12 \cdot 10=\mathbf{120}$

| Phase Resistance Calculation | |
|---|---|
| Copper area per conductor | 46571 $mm^2$ |
| Electric resistance per meter wire @20 C | 37021 mΩ/m |
| Turn length=2(active length+end turn)<br>active length=170mm; end turn length=172mm | 72946 mm |
| Length per phase | 8754 m |
| Phase-star point resistance, calculated@20 C | 3 41 mΩ |
| Phase-phase resistance, calculated@20 C | 648 mΩ |

Single layer winding/Einschichtwicklung (Hairpin):

| a | q | p | *N_Cond* | *N_Turns* | *N_Slots* |
|---|---|---|---|---|---|
| 1 | 2 | 2 | 30 | 120 | 24 |
| 1 | 3 | 2 | 20 | 120 | 36 |
| 1 | 4 | 2 | 15 | 120 | 48 |
| 1 | 5 | 2 | 12 | 120 | 60 |
| **1** | **6** | **2** | **10** | **120** | **72** |

FIG. 15

HIGH EFFICIENCY ELECTRICAL MOTOR

BACKGROUND

Electrical motors are used in various applications. For instance, electrical motors may be used to drive fans, appliances, electric tools, vehicles, and the like. In general, an electrical motor includes a rotor positioned inside a stator. The rotor moves to supply mechanical power, while the stator remains stationary.

BRIEF DESCRIPTION OF THE DRAWINGS

Various embodiments in accordance with the present disclosure will be described with reference to the drawings, in which:

FIG. 3 illustrates an example of simulation results of an electrical motor compared to a conventional motor, according to an embodiment of the present disclosure;

FIG. 4 illustrates an example of active geometry of a stator and a rotor, according to an embodiment of the present disclosure;

FIG. 5 illustrates an example of geometry of a stator, according to an embodiment of the present disclosure;

FIG. 14 illustrates an example of a winding configuration for an electrical motor, according to an embodiment of the present disclosure;

FIG. 15 illustrates another example of a winding configuration for an electrical motor, according to an embodiment of the present disclosure;

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to, among other things, a high efficiency electrical motor. In an example, an electrical motor can include a housing, a stator, a first set of winding pins, a second set of winding pins, and a rotor. The stator can be disposed within the housing and can have a length that is at least 40% of a length of the housing. That may be possible because no internal cooling fans is used, thereby providing additional volume for the stator. Cooling can be provided by a design of the housing (e.g., using aluminum for the housing, with cooling fins angled at a non-zero degree relative to the longitudinal axis of the housing). By increasing the size of the stator, the overall electrical resistance of the windings can be reduced, thereby reducing the thermal heat while also improving the overall motor efficiency. The stator includes a first number of slots (e.g., between sixty-four slots and eighty slots) that include windings. The winding pins of the first set of winding pins can have a height between twenty-five and thirty-five millimeters and are electrically coupled with at least one winding. The second set of winding pins are also electrically coupled with at least one winding. The rotor surrounds the stator, the first set of winding pins, and the second set of winding pins. The rotor includes a second number of slots (e.g., between fifty-six slots and seventy-two slots) that also include windings. In an example, the electrical motor may be coupled to an external cooling fan for cooling a datacenter rack.

Embodiments of the present disclosure provide several technical advantages over conventional electrical motors. Conventionally, windings for electrical motors are wound by hand because the stator slots are partially closed, resulting in a widening of the stator teeth at the top. Hence, according to an embodiment, the stator teeth are open in such a way that the assembled stator windings can be slipped directly down onto the stator, obviating any need to hand-wind the conductor assembly. Embodiments disclosed herein additionally use three-dimensional (3D) printing of conductors applied onto a stator. In addition, due to the configuration of stator slots and rotor slots, as well as the removal of an internal fan from the electrical motor described herein, the electrical motor may provide a higher torque output with a lower power consumption.

Figure 1:
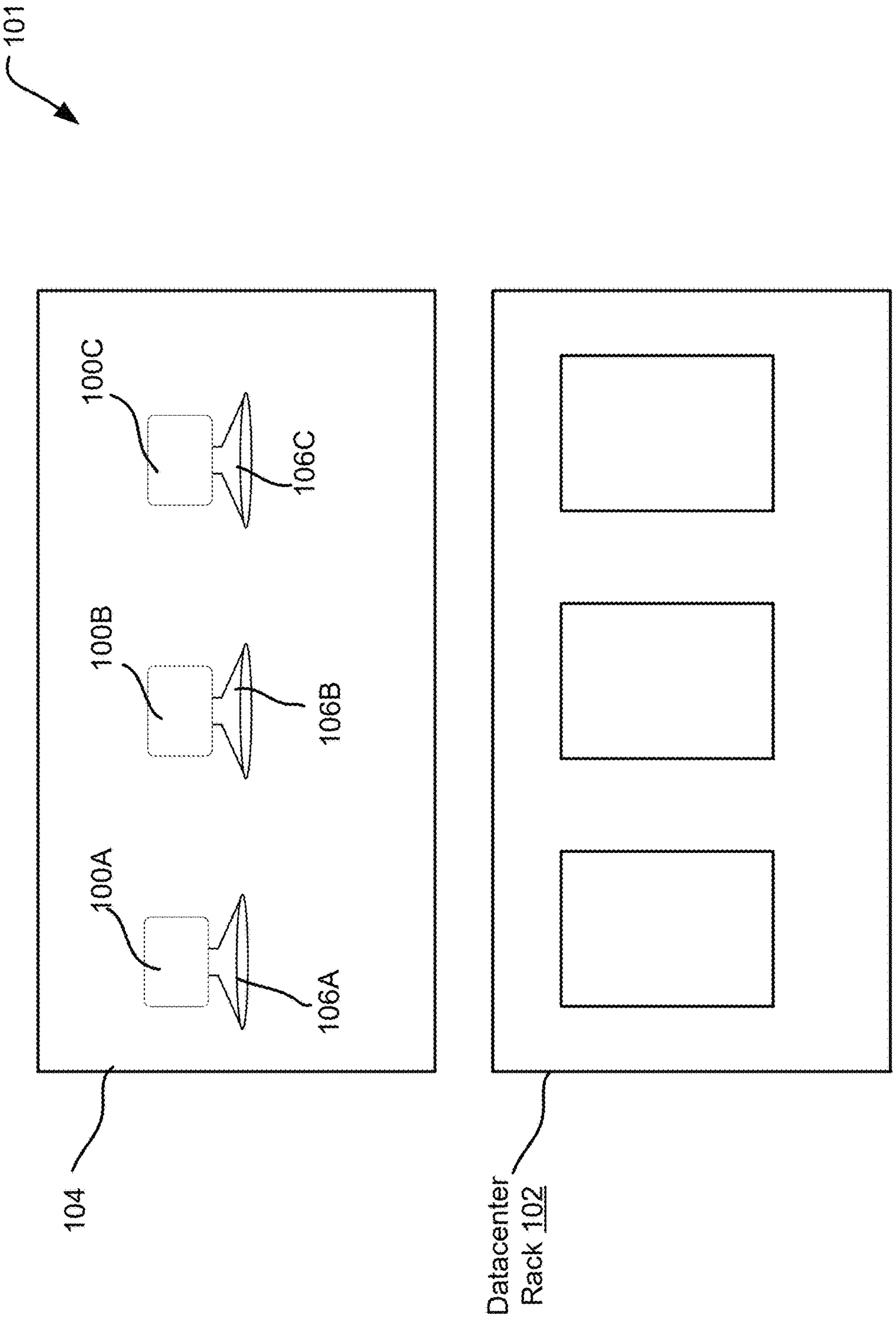
FIG. 1 illustrates an example of a top view of a datacenter that includes electrical motors, according to an embodiment of the present disclosure.

FIG. 1 illustrates an example of a top view of a datacenter 101 that includes electrical motors 100A-100C, according to an embodiment of the present disclosure. The datacenter 101 includes an air handler unit 104 and a datacenter rack 102 that can house servers. The air handler unit 104 includes electrical motors 100A-100C that are each electrically coupled to an external cooling fan. That is, electrical motor 100A is electrically coupled to external cooling fan 106A, electrical motor 100B is electrically coupled to external cooling fan 106B, and electrical motor 100C is electrically coupled to external cooling fan 106C. The electrical motors 100A-100C are also electrically coupled with a power source. The electrical motors 100A-100C may be alternating current (AC) or direct current (DC) motors, so the power source may provide AC power or DC power to the electrical motors 100A-100C. The electrical motors 100A-100C are operable to rotate the external cooling fans 106A-106C to cool at least a portion of the datacenter rack 102. In some instances, external cooling fans and electrical motors may be arranged in an array.

Figure 2:
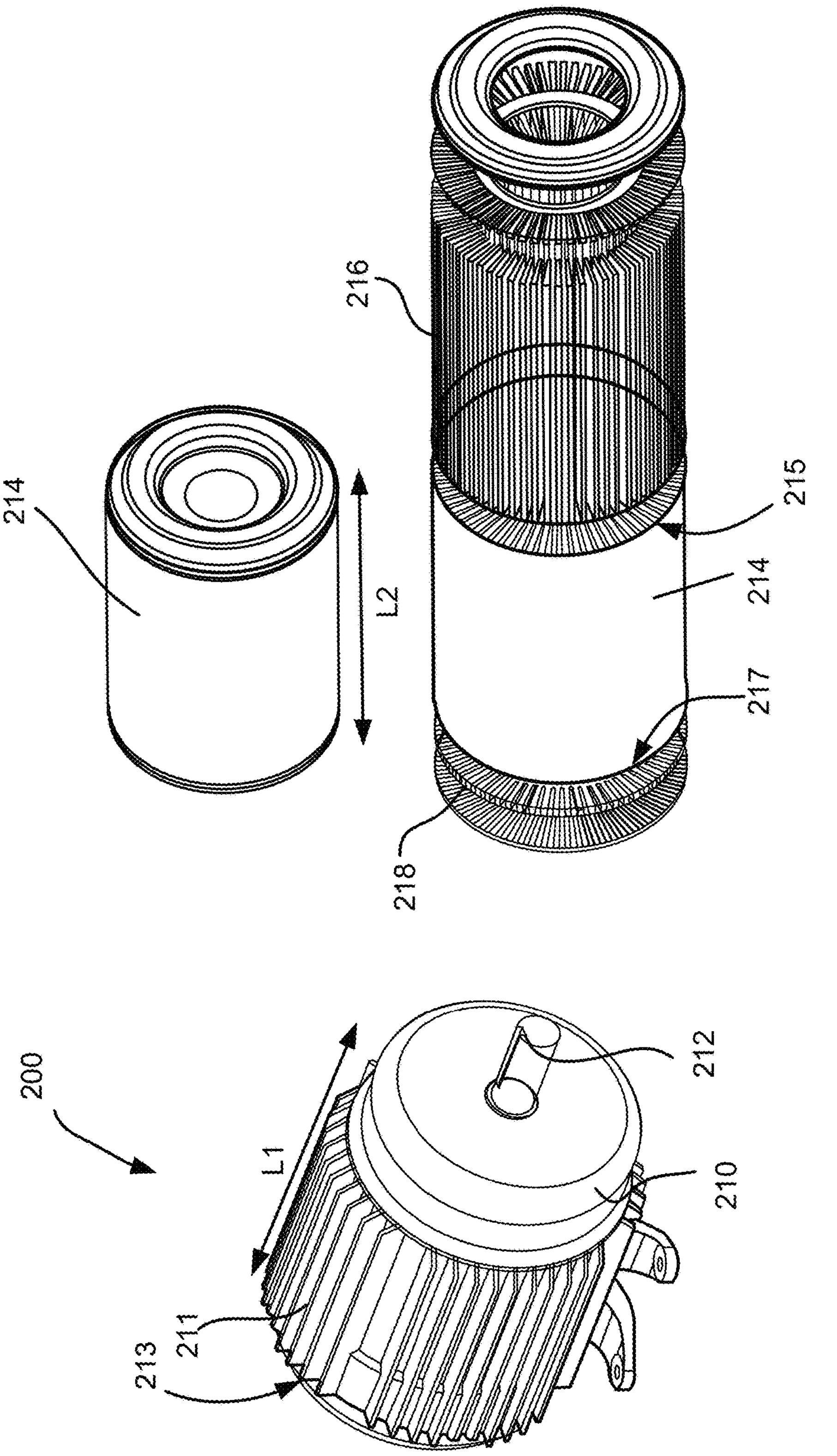
FIG. 2 illustrates an example of an electrical motor, according to an embodiment of the present disclosure.

FIG. 2 illustrates an example of an electrical motor 200, according to an embodiment of the present disclosure. The electrical motor 200 may be a four-pole electrical motor, and may be an example of the electrical motors 100A-100C in FIG. 1. The electrical motor 200 can have a power rating between four and eight kilowatts. For example, the electrical motor 200 may have a power rating of 5.5 kilowatts. The electrical motor 200 includes a housing 210 having a length (L1) that is compliant with the national manufacturers association (NEMA) 213T standard. The NEMA 213T standard may indicate that the housing 210 is to have a length of three-hundred eighty-four millimeters. The housing 210 can be formed with an aluminum material and can include cooling fins 211 on an external surface 213 of the housing 210. The electrical motor 200 also includes a shaft 212 extends from the housing 210. An external cooling fan (e.g., the external cooling fans 106A-106C) can be mounted to the shaft 212.

In an example, the electrical motor 200 includes a stator 214 that is disposed in the housing 210. A collapsed view and an exploded view of the stator 214 are shown in FIG. 2. The stator 214 has a length (L2) that is at least 40% of L1. For instance, L2 may be between fifteen centimeters and twenty centimeters. In a particular example, L2 may be one-hundred seventy millimeters, so L2 may be approximately 44% of L1. As such, a motor cooling fan may be excluded from the housing 210. The motor cooling fan can refer to a cooling fan that is internal to the housing 210 or that is mounted on the housing 210 and that provides cooling internally to the housing 210. In some cases, the electrical motor 200 may be a total enclosed, non-ventilated (TENV) fan in which there may not be an external cooling fan or an internal cooling fan for cooling the housing 210, which can result in reduced power consumption. A first set of winding pins 216 can be attached to a first side 215 of the stator 214. For instance, the first set of winding pins 216 may be three-dimensionally (3D) printed on the first side 215. The first set of winding pins 216 may be made of an electrically conductive material. For example, the first set of winding pins 216 may be made of copper, aluminum, silver, gold, or other high conductivity electrical materials. Current is passed through first set of winding pins 216 to induce a magnetic field in stator cores. The electrical motor 200 can also include a second set of winding pins 218 attached to a second side 217 of the stator 214 that is opposite the first side 215. The second set of winding pins 218 can carry the current induced by stator 214. In an embodiment, the second set of winding pins 218 are of a solid disc of conductive material that includes a number of cavities. The second set of winding pins 218 may or may not be 3D printed on the second side 217. For instance, only one of the first set of winding pins 216 or the second set of winding pins 218 may be 3D printed.

Although not shown in FIG. 2, the stator 214 can surround a rotor. The stator 214 may be configured to surround the rotor with a predetermined air gap such that the rotor is rotatable inside the stator 214. The first set of winding pins 216 and the second set of winding pins 218 can also surround the rotor. The shaft 212 can be attached to the rotor. Each of the stator 214 and the rotor can include a number of slots that include windings. The windings may be hairpins. The stator 214 may have between sixty-four slots to eighty slots, whereas the rotor may have between fifty-six slots and seventy-two slots. A slot of the stator 214 can include first windings. A first winding pin of the first set of winding pins 216 can be electrically coupled with at least a first winding of the first windings. In addition, a second winding pin of the second set of winding pins 218 can be electrically coupled with at least the first winding.

FIG. 3 illustrates an example of simulation results of an electrical motor compared to a conventional motor, according to an embodiment of the present disclosure. The conventional NEMA 213T compliant motor is referred to as "Motor 1" and the electrical motor of the present disclosure is referred to as "Motor 2". The electrical motor of the present disclosure is an example of the electrical motor 200 in FIG. 2. As indicated, Motor 2 has improved efficiency and reduced losses compared to Motor 1 in cold weather, mid-range weather, and warm weather. Accordingly, Motor 2 is a better electrical motor than Motor 1.

FIG. 4 illustrates an example of active geometry of a stator 414 and a rotor 420, according to an embodiment of the present disclosure. The stator 414 is an example of the stator 214 in FIG. 2. The stator 414 surrounds the rotor 420, and there is an air gap between 0.2 mm and 0.4 mm between the stator 414 and the rotor 420. In FIG. 4, the air gap is indicated as being 0.3 mm. The stator 414 has an outer diameter of two-hundred nineteen mm and an active length of one-hundred seventy mm. The stator 414 includes first slots 419 that each include windings. As illustrated, the stator 414 includes seventy-two slots, but the stator 414 may include the first slots 419 in a range of sixty-four slots to eighty slots. The first slots 419 may have a trapezoidal geometrical shape or a rectangular geometric shape.

In an example, the rotor 420 has an outer diameter of 134.3 mm. The rotor 420 includes second slots 421, which are fewer in number than the first slots 419. As illustrated, the rotor 420 includes sixty-four slots, but the rotor 420 may include second slots 421 in a range of fifty-six slots to seventy-two slots. The second slots 421 also include windings. The second slots 421 have a different geometrical shape than the second slots 421. So, the second slots 421 may have a canonical geometrical shape or a cylindrical geometric shape. In addition, conductors of the windings that are included in the first slots 419 may have a different geometric shape than conductors of the windings that are included in the second slots 421. Or, the conductors may have the same geometric shape. For instance, the conductors in the first slots 419 and the conductors in the second slots 421 may be rectangular conductors. If the conductors are the same shape, the cross-section may be different, meaning that the conductors in the first slot 419 may have a different dimension than the conductors in the second slot 421. A slip angle between a magnetic field axis of the stator 414 and a magnetic field axis of the rotor 420 can be less than one degree.

FIG. 5 illustrates an example of geometry of a stator 514, according to an embodiment of the present disclosure. The stator 514 is an example of the stator 414 in FIG. 4. The stator 514 includes a slot 519. The slot 519 has a trapezoidal shape and includes rectangular conductors 522 of windings. The rectangular conductors 522 may be square. The slot 519 can include between eight and twelve rectangular conductors. In FIG. 5, the slot 519 includes ten rectangular conductors. A fill level of the rectangular conductors 522 in the slot 519 is equal to or larger than 70% of the slot 519. As illustrated, the fill level in FIG. 5 is 70.4%. The slot 519 has a width between 2.7 mm and 3.7 mm (e.g., 3.2 mm). In addition, the slot 519 has a height relative to an air gap that separates the stator 514 and a rotor (e.g., rotor 420 in FIG.

4) that is sized between 0.2 mm and 0.4 mm. The height relative to the air gap is between nineteen mm and twenty-three mm (e.g., 21.05 mm). The slot 519 also includes an opening 523 that extends into the stator 514. A height of the opening 523 is between 0.5 mm and one mm (e.g., 0.8 mm), and a width of the opening 523 is between 0.8 mm and 1.5 mm (e.g., 1.1 mm).

Figure 6:
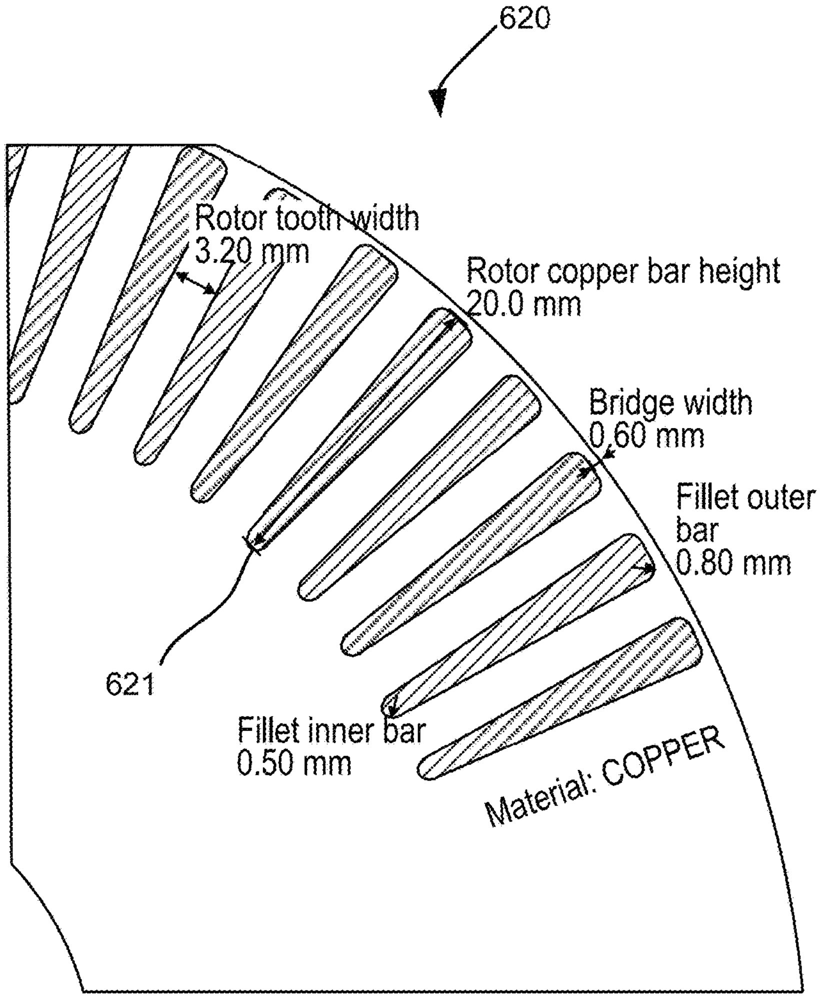
FIG. 6 illustrates an example of geometry of a rotor, according to an embodiment of the present disclosure.

FIG. 6 illustrates an example of geometry of a rotor 620, according to an embodiment of the present disclosure. The rotor 620 is an example of the rotor 420 in FIG. 4. The rotor 620 includes a slot 621 that has a canonical shape that can include circular conductors of windings. The slot 621 may have a different fill level of conductors than the slot 519 in FIG. 5. The slot 621 has a height between eighteen mm and twenty-two mm (e.g., twenty mm). There is a distance of between 0.5 mm and 0.7 mm (e.g., 0.6 mm) between the slot 621 and an air gap that separates the rotor 620 from a stator (e.g., stator 414 in FIG. 4). In addition, a width between the slot 621 and an adjacent slot of the rotor 620 is between three mm and 3.4 mm (e.g., 3.2 mm).

Figure 7:
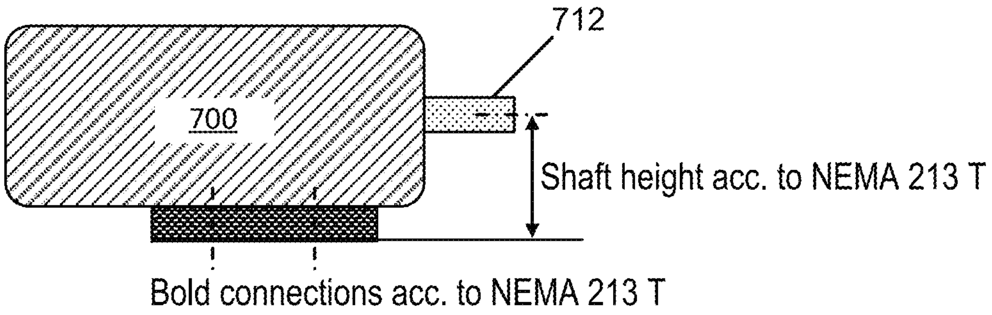
FIG. 7 illustrates an example of constraints for an electrical motor, according to an embodiment of the present disclosure.

FIG. 7 illustrates an example of constraints for an electrical motor 700, according to an embodiment of the present disclosure. The electrical motor 700 is an example of the electrical motor 100 in FIG. 1. The electrical motor 700 may be configured to replace a conventional NEMA 213T compliant motor. As such, the electrical motor 700 may meet the same NEMA 213T standard as the conventional motor. So, a height to a center axis of a shaft 712 that extends from the electrical motor 700 to operate an external fan can meet the NEMA 213T standard. In addition, positions and sizes of bore holes for mounting the electrical motor 700 can also meet the NEMA 213T standard. The electrical motor 700 can additionally exclude an internal cooling fan.

Figure 8:
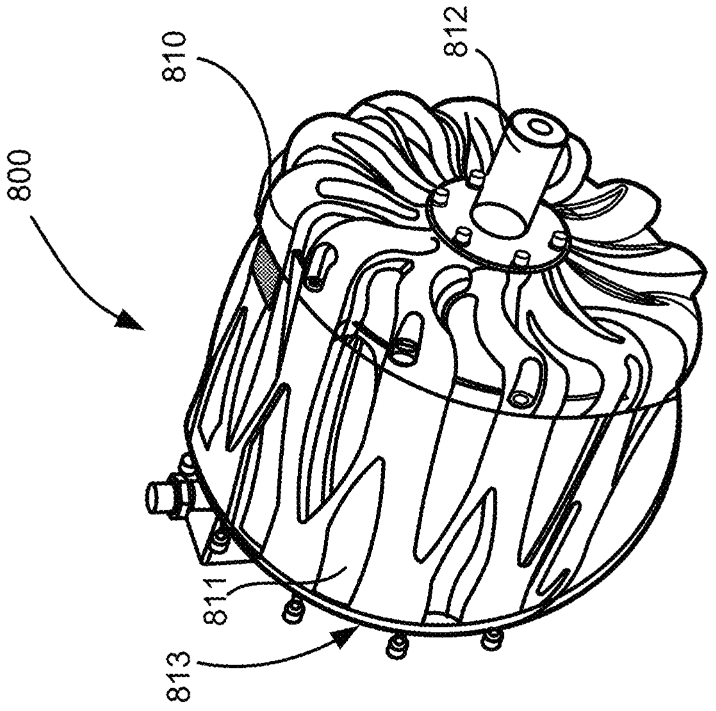
FIG. 8 illustrates an example of a housing for an electrical motor, according to an embodiment of the present disclosure.
Figure 9:
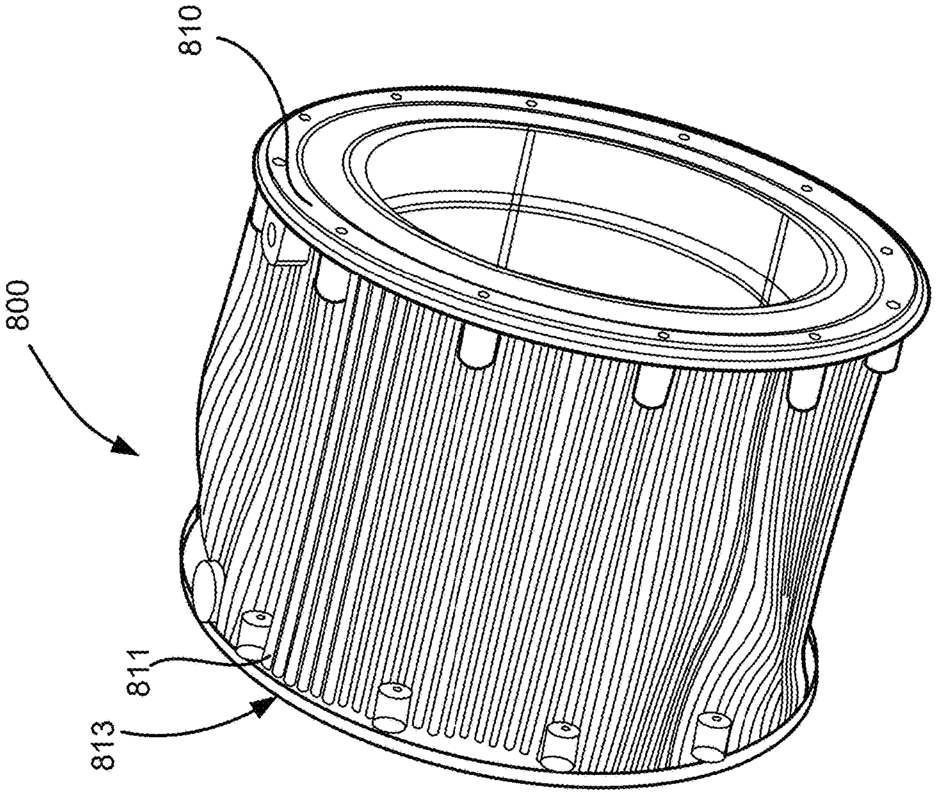
FIG. 9 illustrates another example of a housing for an electrical motor, according to an embodiment of the present disclosure.

FIGS. 8-12 illustrate examples of features for an electrical motor 800, according to an embodiment of the present disclosure. The electrical motor 800 is an example of the electrical motor 100 in FIG. 1. The electrical motor 800 includes a housing 810 and a shaft 812 that extends from the housing 810 to which an external cooling fan can be mounted. The housing 810 is formed with an aluminum material and includes cooling fins 811 at an external surface 813. The cooling fins 811 are at an angle between thirty degrees and ninety degrees relative to a longitudinal axis of the housing 810. For instance, the cooling fins 811 may be at an angle of sixty degrees relative to the longitudinal axis. The cooling fins 811 may be curved, as illustrated in FIG. 8, or may be straight, as illustrated in FIGS. 9-12.

Figure 10:
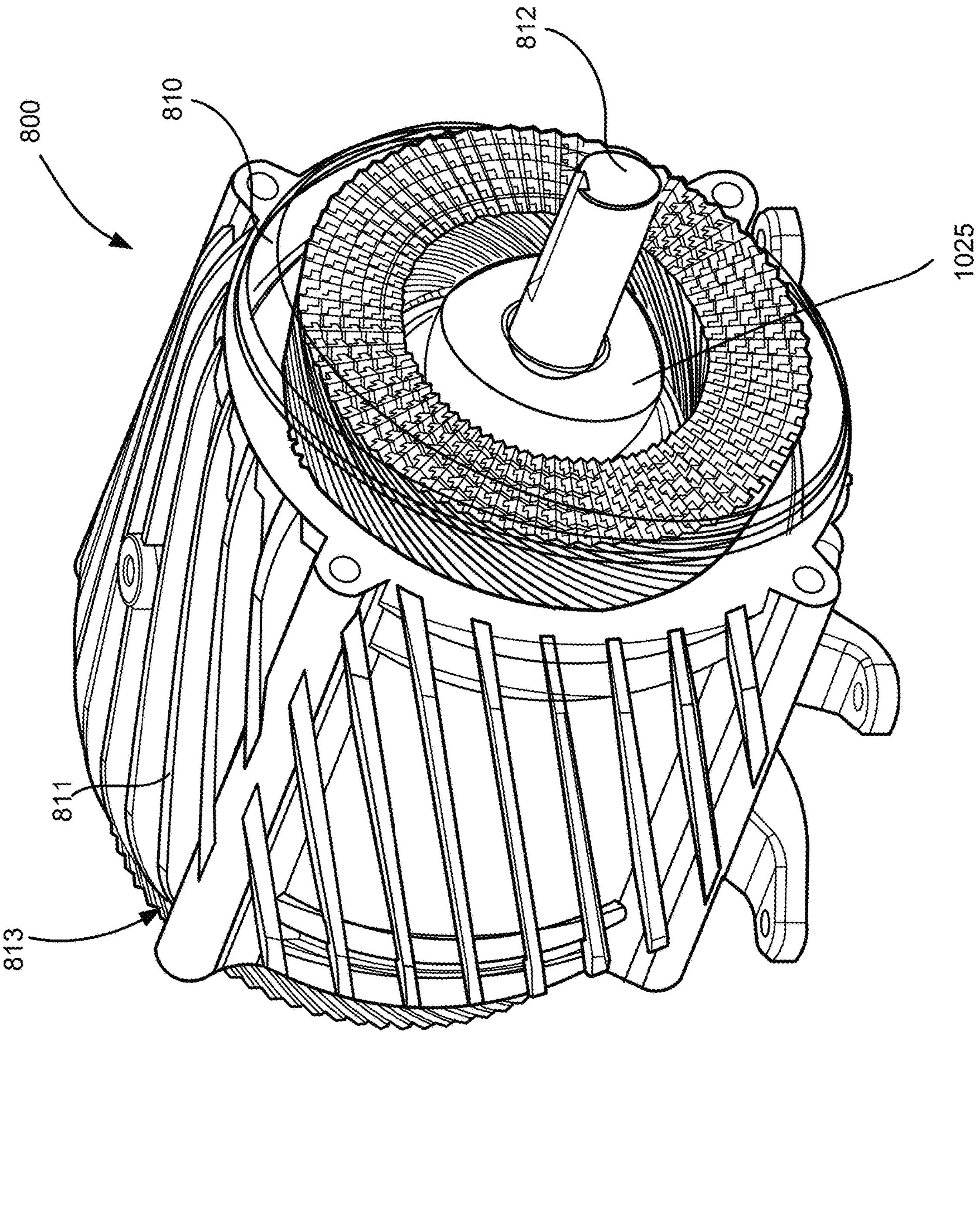
FIG. 10 illustrates an example of a bearing for an electrical motor, according to an embodiment of the present disclosure.

In an example, as shown in FIG. 10, ceramic-based bearings 1025 can support rotation of the shaft 812 with minimal friction. The ceramic-based bearings 1025 may be ball bearings or roller bearings. In this way, the ceramic-based bearings 1025 allow the shaft 812 to spin while providing adequate support. Although only one ceramic-based bearing is visible in FIG. 10, the electrical motor 800 may include multiple ceramic-based bearings along a length of the shaft 812.

Figure 11:
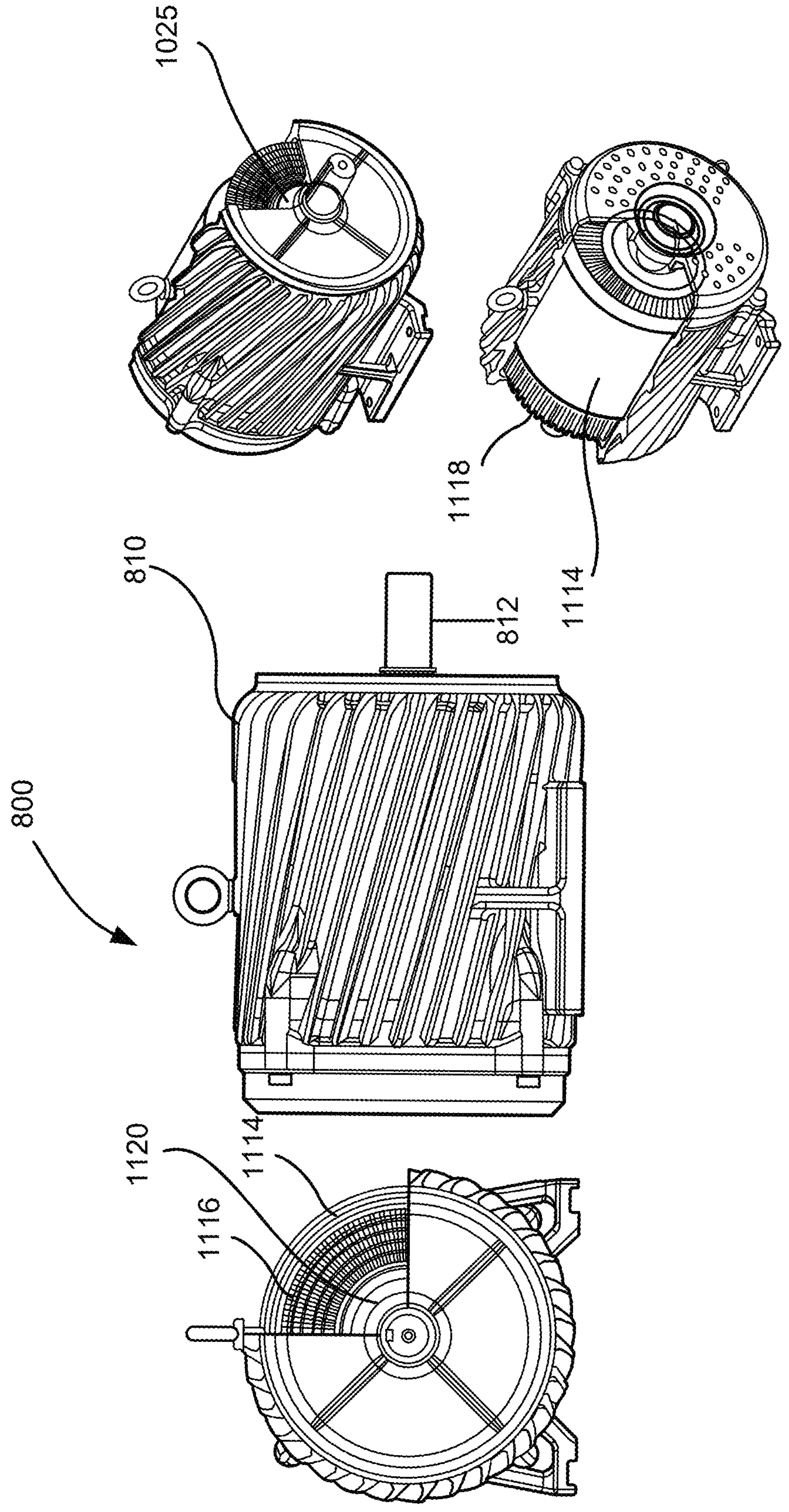
FIG. 11 illustrates example views of an electrical motor, according to an embodiment of the present disclosure.
Figure 12:
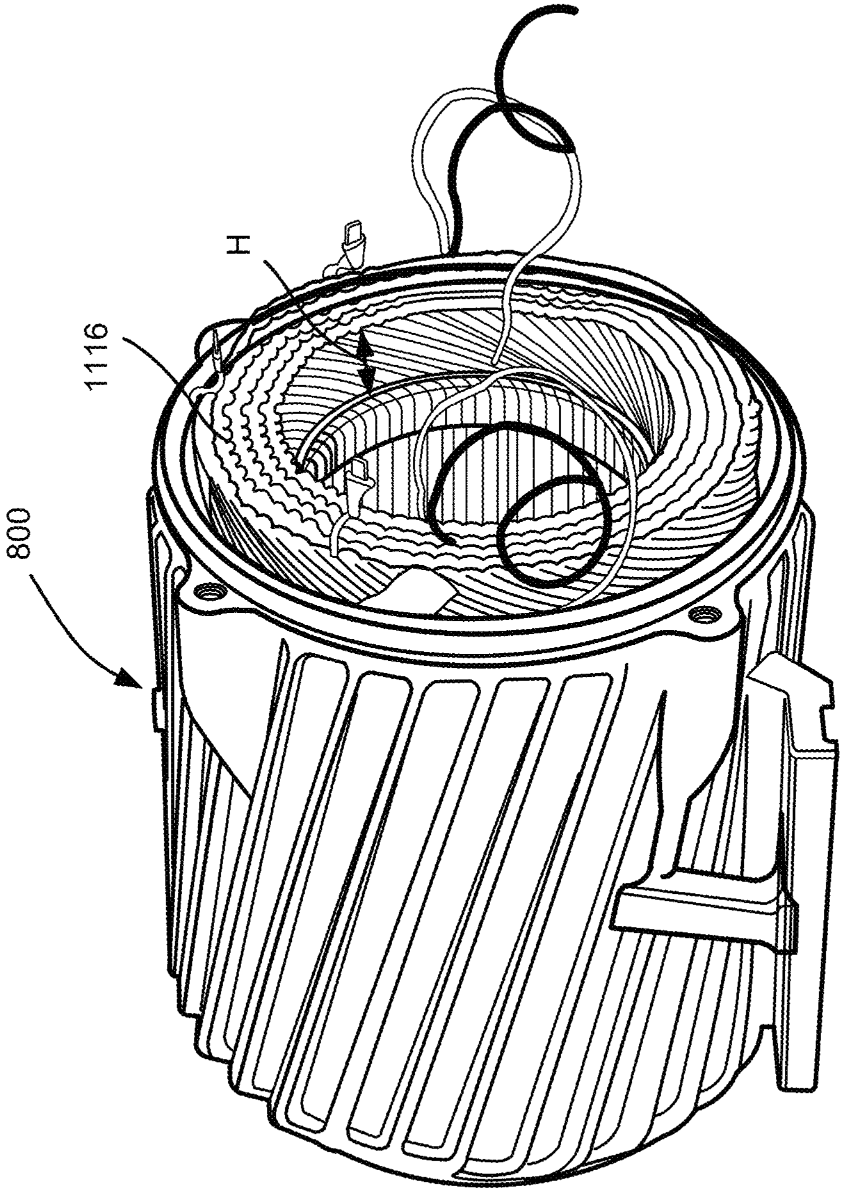
FIG. 12 illustrates another example of an electrical motor, according to an embodiment of the present disclosure.

As shown in FIG. 11, the electrical motor 800 includes a stator 1114, which is an example of stator 214 in FIG. 2, that is disposed in the housing 810. A first set of winding pins 1116 is attached to a first side of the stator 1114 and a second set of winding pins 1118 is attached to a second side of the stator 1114 that is opposite the first side. The stator 1114 surrounds a rotor 1120. The first set of winding pins 1116 and the second set of winding pins 1118 also surround the rotor 1120. A winding pin in the first set of winding pins 1116 can have a height between twenty-five and thirty-five millimeters, as indicated by "H" in FIG. 12. For instance, the winding pin may have a height of thirty millimeters.

Figure 13:
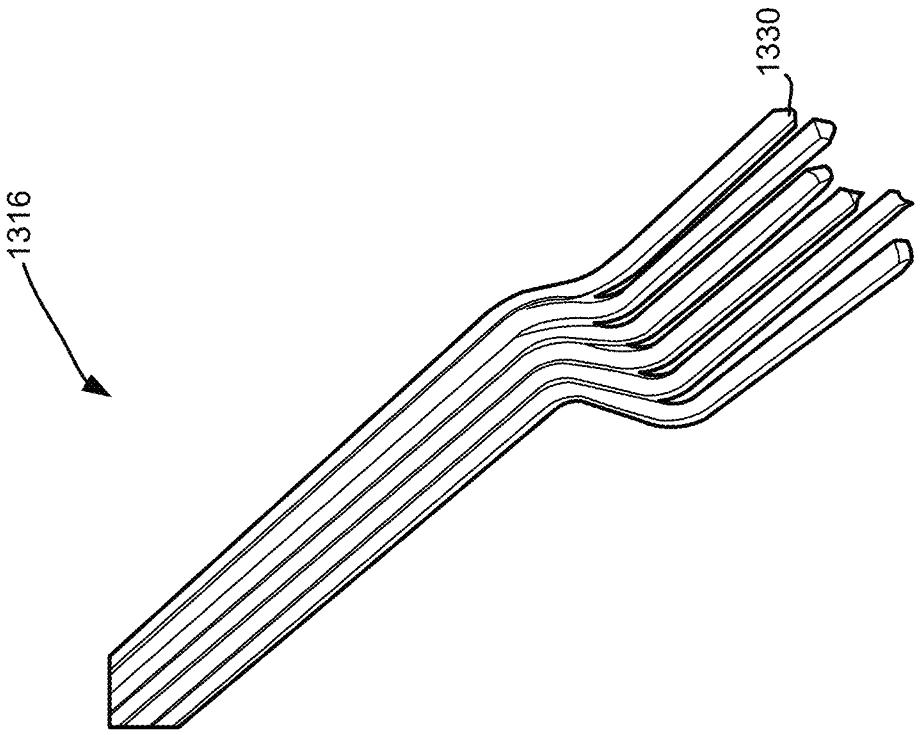
FIG. 13 illustrates a partial view of an example of a set of winding pins of an electrical motor, according to an embodiment of the present disclosure.

FIG. 13 illustrates a partial view of an example of a set of winding pins 1316 of an electrical motor, according to an embodiment of the present disclosure. The set of winding pins 1316 is an example of the first set of winding pins 216 in FIG. 2. Each winding pin of the set of winding pins 1116 may include, for example, a first insertion part 1330 that can be inserted into a slot of a stator (e.g., slot 519 of stator 514 in FIG. 5) at one side along the circumferential direction of the stator. A second insertion part that is not visible in FIG. 13 can be inserted into another slot spaced apart from the first insertion part 1330. The set of winding pins 1316 can be bent along a radial direction.

FIGS. 14-15 illustrates examples of winding configurations for an electrical motor, according to an embodiment of the present disclosure. The electrical motor is an example of the electrical motor 200 in FIG. 2. In each case, the windings are hairpins in one layer. There are four poles, three phases (U, V, and W), and six slots per pole and phase. Accordingly, a stator of the electrical motor includes seventy-two slots with ten conductors per slot. So, the number of turns in series per phase in one-hundred twenty.

Figure 16:
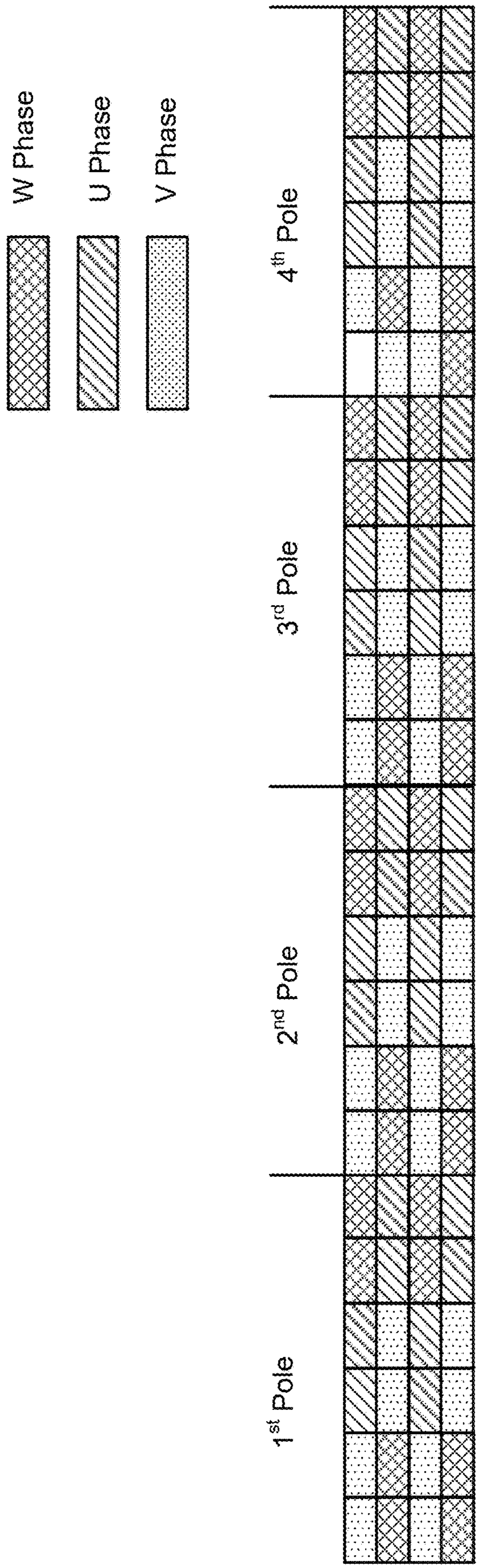
FIG. 16 illustrates an example of a winding diagram for an electrical motor, according to an embodiment of the present disclosure.

FIG. 16 illustrates an example of a winding diagram for an electrical motor 1600, according to an embodiment of the present disclosure. The electrical motor 1600 is an example of the electrical motor 200 in FIG. 2. The electrical motor can be a four-pole electrical motor that conducts current in three phases-W phase, U phase, and V phase. So, each pole can be associated with a group of slots of a stator (e.g., stator 214 in FIG. 2). Each column corresponds to a slot in FIG. 16. Although only twenty-four slots are shown in FIG. 16 for simplicity, where there are six slots per pole, in the electrical motor with seventy-two slots in the stator, there are eighteen slots per pole. Each of the slots may have between eight and twelve conductors, but four conductors are illustrated for each slot in FIG. 16, represented by the rows. Each conductor is assigned to one of the three phases. A wire from a conductor of a phase in one slot is connected to a conductor of the same phase in another slot. The wires are wound in the winding pattern so that all the conductors of a given phase are connected together.

In FIG. 16, two adjacent slots may be defined as a pair of slots, and conductors, to which current of two AC phases is applied, may be wound in the pair of slots. However, the pair of slots may include three or more adjacent slots. In one slot, two conductors may be wound to apply current of different AC phases. In this case, the conductors may be wound as 2-distribution short-pitch winding. The two distribution means that two conductors, to which the same AC phases are successively applied, are disposed based on a horizontal direction of the slots, and may mean that two slots are defined as a pair of slots, and conductors, to which current of different AC phases is applied, are wound in each of the pair of slots.

In an example, conductors are energized by different AC phases on an innermost side and an outermost side based on a direction toward a rotating shaft of the electrical motor, and the conductors may be wound on each of all the slots defined in the stator. In one form, four conductors may be wound in one slot, and conductors, which are energized by the same AC phases as the AC phases of a first conductor and a second conductor, are disposed between the first conductor that is the outermost conductor and the second conductor that is the innermost conductor. In other words, the conductors disposed in odd positions based on the first conductor may be energized by the same AC phase as the AC phase of the first conductor, and the conductors disposed in even positions based on the first conductor may be energized by the same AC phase as the AC phase of the second conductor. The conductors disposed in the respective slots may be conductors which are energized by 2-phase AC phases among 3-phase AC phases. Any one of the conductors disposed in the respective slots may be energized by an AC phase different from the AC phase of the other adjacent conductor.

As an example, four conductors may be disposed in one slot. The conductors disposed in odd positions based on the first conductor disposed on the outermost side in the slot may be energized by the same AC phases, and the conductors disposed in even positions based on the first conductor disposed on the outermost side in the slot may be energized by the same AC phases. The conductors disposed in odd positions of any one of pairs of slots adjacent to each other and the conductors disposed in the even positions of the other pair of slots may be energized by the same AC phases. The conductors disposed in odd positions of the any one pair of slots may be defined as fundamental parts, and the conductors disposed in even positions of the other pair of slots may be defined as short-pitch part. The fundamental parts and the short-pitch part may be called the conductors being energized by the same AC phases, and the short-pitch part may be broken at an electric angle of 60 degrees from the fundamental parts.

In an example, the conductors, to which V-phase current is applied, may be wound on the outermost conductors of the first slot and second slot of a first pole and the conductors disposed in odd positions based on the outermost conductors. In addition, the conductors to which W-phase current is applied, may be wound on the conductors disposed in even positions based on the outermost conductors of the first slot and second slot of the first pole. The conductors to which V-phase current is applied may be wound on the conductors disposed firstly and thirdly based on the farthest side based on the direction toward the rotating shaft of the electrical motor. The conductors, to which W-phase current is applied, may be wound on the conductors disposed secondly and fourthly based on the farthest side based on the direction toward the rotating shaft of the electrical motor. The conductors, to which V-phase current is applied, may be wound on an innermost conductors of the third slot and fourth slot of the first pole and the conductors disposed in odd positions based on the innermost conductors. Additionally, the conductors, to which U-phase current is applied, may be wound on the conductors disposed in the even positions based on the innermost conductors of the third slot and fourth slot of the first pole. In other words, the conductors, to which U-phase current is applied, may be wound on the conductors disposed firstly and thirdly based on the farthest side based on the direction toward the rotating shaft of the electrical motor, and the conductors, to which V-phase current is applied, may be wound on the conductors disposed secondly and fourthly based on the farthest side based on the direction toward the rotating shaft of the electrical motor. The above-described pattern may be formed in the same manner over the whole four poles of the electrical motor.

Figure 17:
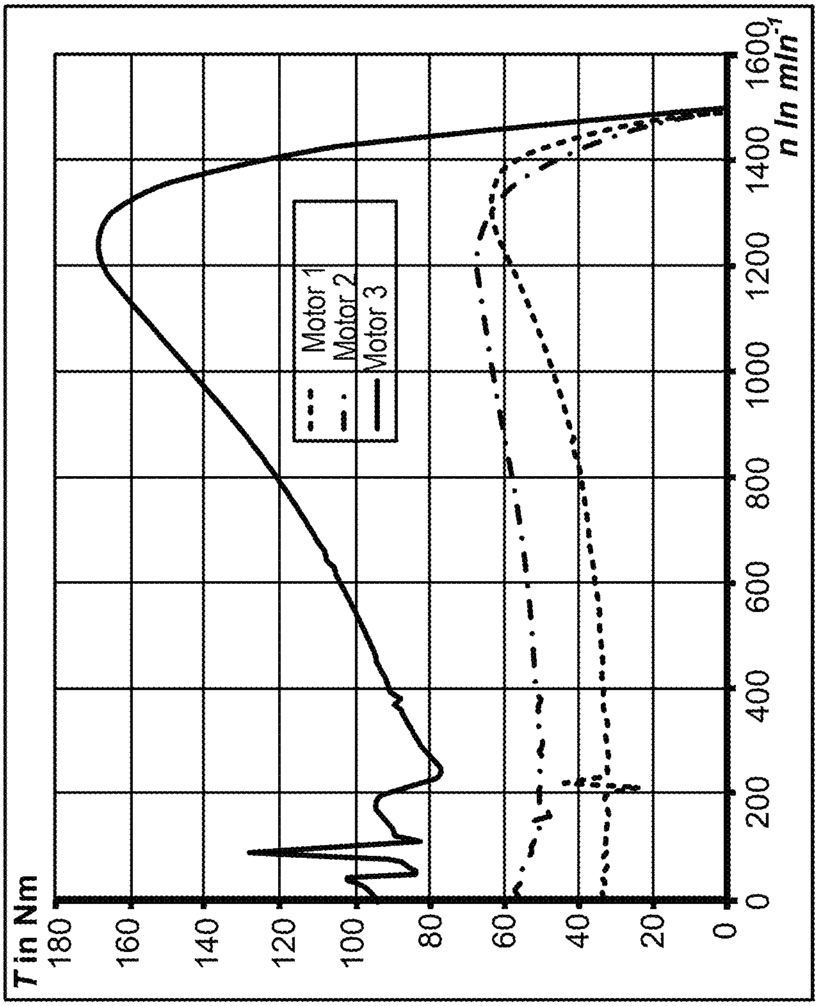
FIG. 17 illustrates an example of torque for electrical motors, according to an embodiment of the present disclosure.

FIG. 17 illustrates an example of torque for electrical motors, according to an embodiment of the present disclosure. "Motor 3" is an example of electrical motor 200 in FIG. 2, whereas "Motor 1" and "Motor 2" are examples of conventional NEMA 213T compliant electrical motors. As illustrated, Motor 1 produces an output torque that is equal to or larger than one-hundred sixty Nm at a rotations per minute (RPM) equal to or larger than twelve-hundred RPM. This is significantly larger than the torque outputs of Motor 1 and Motor 2, which are both less than seventy Nm at equal to or larger than twelve-hundred RPM.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A system comprising:

a power source;

an external cooling fan operable to cool at least a portion of a datacenter rack; and a four-pole electrical motor electrically coupled with the power source and operable to rotate the external cooling fan, the four-pole electrical motor comprising:

a housing having a first length compliant with national electrical manufacturers association (NEMA) 213T standard;

a shaft that extends from the housing and to which the external cooling fan is mounted;

a stator disposed in the housing and having a second length that is at least forty percent of the first length wherein the four-pole electrical motor excludes a motor cooling fan based at least in part on the second length, the stator including a first number of slots in a first range of sixty-four slots to eighty slots, a first slot of the stator including a first plurality of windings;

a first set of winding pins that are three-dimensionally (3D) printed on a first side of the stator, wherein the first set includes a first winding pin having a height between twenty-five and thirty-five millimeters and electrically coupled with at least a first winding of the first plurality of windings;

a second set of winding pins that are attached to a second side of the stator opposite the first side, wherein the second set includes a second winding pin electrically coupled with at least the first winding; and a rotor surrounded by the stator, the first set of winding pins, and the second set of winding pins and to which the shaft is attached, the rotor including a second number of slots, the second number being smaller than the first number and in a second range of fifty-six slots to seventy-two slots, a second slot of the rotor including a second plurality of windings.

2. The system of claim 1, wherein the housing is formed with an aluminum material and includes cooling fins on an external surface of the housing, wherein the cooling fins are at an angle between thirty degrees and ninety degrees relative to a longitudinal axis of the housing.

3. The system of claim 1, wherein the first slot has a trapezoidal shape and includes rectangular conductors of the first plurality of windings, wherein a fill level of the rectangular conductors in the first slot is equal to or larger than seventy percent of the first slot.

4. The system of claim 3, wherein the second slot has a canonical shape and includes circular conductors of the second plurality of windings.

5. An electrical motor comprising:

a housing having a first length;

a stator disposed in the housing and having a second length that is at least forty percent of the first length, the stator including a first number of slots in a first range of sixty-four slots to eighty slots, a first slot of the stator including a first plurality of windings;

a first set of winding pins attached to a first side of the stator, wherein the first set includes a first winding pin having a height between twenty-five and thirty-five millimeters and electrically coupled with at least a first winding of the first plurality of windings;

a second set of winding pins that are attached to a second side of the stator opposite the first side, wherein the second set includes a second winding pin electrically coupled with at least the first winding; and a rotor surrounded by the stator, the first set of winding pins, and the second set of winding pins, the rotor including a second number of slots, the second number being smaller than the first number and in a second range of fifty-six slots to seventy-two slots, a second slot of the rotor including a second plurality of windings.

6. The electrical motor of claim 5, wherein the first length is compliant with national electrical manufacturers association (NEMA) 213T standard, and further comprising:

a shaft that extends from the housing and that is configured to rotate a cooling fan associated with cooling a datacenter rack.

7. The electrical motor of claim 6, wherein a plurality of ceramic-based bearings support rotation of the shaft.

8. The electrical motor of claim 5, wherein the electrical motor is a four-pole motor, wherein the first number is equal to seventy-two, wherein the second number is equal to sixty-four, and wherein the second length is between 15 cm and 20 cm.

9. The electrical motor of claim 5, wherein the first slot has a width between 2.7 mm and 3.7 mm.

10. The electrical motor of claim 5, wherein an air gap sized between 0.2 mm and 0.4 mm separates the stator and the rotor, and wherein a height of the first slot relative to the air gap is between 19 mm and 23 mm.

11. The electrical motor of claim 10, wherein the first includes an opening that starts at the air gap and extends into the stator, wherein a height of the opening is between 0.5 mm and 1 mm, and wherein a width of the opening is between 0.8 mm and 1.5 mm.

12. The electrical motor of claim 5, wherein the first slot includes between eight and twelve rectangular conductors of the first plurality of windings.

13. An assembly comprising:

a housing having a first length;

a stator disposed in the housing and having a second length that is at least forty percent of the first length such that an internal cooling fan is excluded from the housing, the stator including a first number of slots in a first range of sixty-four slots to eighty slots, a first slot of the stator including a first plurality of windings;

a first set of winding pins attached to a first side of the stator, wherein the first set includes a first winding pin having a height between twenty-five and thirty-five millimeters and electrically coupled with at least a first winding of the first plurality of windings;

a second set of winding pins that are attached to a second side of the stator opposite the first side, wherein the second set includes a second winding pin electrically coupled with at least the first winding; and a rotor surrounded by the stator, the first set of winding pins, and the second set of winding pins, the rotor including a second number of slots, the second number being smaller than the first number and in a second range of fifty-six slots to seventy-two slots, a second slot of the rotor including a second plurality of windings.

14. The assembly of claim 13, wherein the first slot has a different geometrical shape than the second slot, and wherein the first slot has a different fill level of conductors than the second slot.

15. The assembly of claim 13, wherein the first slot has a trapezoidal geometric shape or a rectangular geometric shape, and wherein the second slot has a canonical geometric shape or a cylindrical geometric shape.

16. The assembly of claim 13, wherein the first slot includes a first conductor of the first plurality of windings, wherein the second slot includes a second conductor of the second plurality of windings, wherein the first conductor has a different cross section than the second conductor.

17. The assembly of claim 13, wherein a slip angle between a first magnetic field axis of the stator and a second magnetic field axis of the rotor is less than one degree.

18. The assembly of claim 13, wherein the stator and the rotor are components of an electrical motor, and wherein an output torque of the electrical motor is equal to or larger than 160 Nm at a rotations per minute (RPM) equal to or larger than 1,200 RPM.

19. The assembly of claim 13, wherein an external surface of the housing includes cooling fins that are at an angle between thirty degrees and ninety degrees relative to a longitudinal axis of the housing.

20. The assembly of claim 13, wherein only one of the first set of winding pins or the second set of winding pins is three-dimensionally printed on a corresponding side of the stator.

* * * * *